US006673147B2

(12) United States Patent
Kononchuk et al.

(10) Patent No.: US 6,673,147 B2
(45) Date of Patent: *Jan. 6, 2004

(54) HIGH RESISTIVITY SILICON WAFER HAVING ELECTRICALLY INACTIVE DOPANT AND METHOD OF PRODUCING SAME

(75) Inventors: Oleg V. Kononchuk, Brush Prairie, WA (US); Sergei V. Koveshnikov, Vancouver, WA (US); Zbigniew J. Radzimski, Brush Prairie, WA (US); Neil A. Weaver, Battle Ground, WA (US)

(73) Assignee: SEH America, Inc., Vancouver, WA (US)

( * ) Notice: Subject to any disclaimer, the term of this patent is extended or adjusted under 35 U.S.C. 154(b) by 134 days.

This patent is subject to a terminal disclaimer.

(21) Appl. No.: 10/008,404

(22) Filed: Dec. 6, 2001

(65) Prior Publication Data

US 2003/0106482 A1 Jun. 12, 2003

(51) Int. Cl.[7] .............................................. C30B 15/20
(52) U.S. Cl. .............................. 117/13; 117/14; 117/36; 117/84; 117/89
(58) Field of Search ............................... 117/13, 14, 36, 117/84, 89

(56) References Cited

U.S. PATENT DOCUMENTS

| 5,258,092 A | 11/1993 | Yamagishi et al. |
| 5,505,157 A | 4/1996 | Hara et al. |
| 5,935,320 A | 8/1999 | Graef et al. |
| 6,077,343 A | 6/2000 | Iida et al. |
| 6,162,708 A | 12/2000 | Tamatsuka et al. |

FOREIGN PATENT DOCUMENTS

| EP | 0 837 159 A1 | 4/1998 |
| EP | 0 962 556 A1 | 12/1999 |
| EP | 0 965 662 A1 | 12/1999 |
| EP | 1 087 041 A1 | 3/2001 |

OTHER PUBLICATIONS

*Influence of Tin Impurities on the Generation and Anneal of Thermal Oxygen Donors in Czochralski Silicon at 450° C.*, V. B. Neimash et al., Journal of the Electrochemical Society, 147(7), 2000, pp. 2727–2733.

*Primary Examiner*—Felisa Hiteshew
(74) *Attorney, Agent, or Firm*—Alston & Bird LLP

(57) ABSTRACT

An improved method of obtaining a wafer exhibiting high resistivity and high gettering effect while preventing the reduction of resistivity due to the generation of oxygen donors provided by: a) using the CZ method to grow a silicon single crystal ingot having a resistivity of 100 Ω·cm or more, preferably 1000 Ω·cm, and an initial interstitial oxygen concentration of 10 to 40 ppma while doping the crystal with an electrically inactive material such as nitrogen, carbon, or tin, b) processing the ingot into a wafer, and c) subjecting the wafer to an oxygen precipitation heat treatment whereby the residual interstitial oxygen content in the wafer is reduced to about 8 ppma or less.

33 Claims, 1 Drawing Sheet

HIGH RESISTIVITY SILICON WAFER HAVING ELECTRICALLY INACTIVE DOPANT AND METHOD OF PRODUCING SAME

FIELD OF THE INVENTION

The present invention relates to a method of producing a high-resistivity silicon wafer. More particularly, the present invention relates to a method of producing a high-resistivity silicon wafer which exhibits minimal change in resistivity upon heat treatment during device processing.

BACKGROUND OF THE INVENTION

High resistivity silicon wafers have conventionally been used for power devices such as high-voltage power devices and thyristors. More recently, C-MOS devices, Schottky barrier diodes, and other semiconductor devices for use in mobile communications have been developed which require the use of high-resistivity silicon wafers. The high-resistivity wafers tend to decrease the effects of parasitic capacitance among the devices of the wafer, allowing the devices to be more closely packed upon the surface of the wafer while, at the same time, reducing signal transmission loss among the devices.

High-resistivity wafers are generally defined as those silicon wafers with resistivity of 100 Ω·cm or greater, and typically have resistivity of 1000 Ω·cm or greater. The initial resistivity of a wafer is established during crystal growth by the precise addition of dopants to the molten polysilicon from which the silicon crystal is formed. By doping, the resistivity of the crystals can be controlled within close tolerances. However, the initial resistivity may be altered, desirably or undesirably, during subsequent processing of the wafer such that the final resistivity of the wafer may be very different from the resistivity directly after crystal growth.

In order to form more devices from a single wafer and therefore reduce the cost per device, larger wafers are generally preferred. As such, while high resistivity silicon wafers may be fabricated by a float zone technique, the limitations on size of the resulting wafers make the Czochralski (CZ) crystal growing method the desired fabrication technique. The CZ method allows wafers having diameters of 200 mm, 300 mm, 400 mm, or larger to be produced. In addition to the large wafer diameter, the CZ method also provides wafers with excellent planar resistivity distribution and lower cost. Good planar resistivity distribution means that the wafer has only minimal variations in resistivity along the plane which was perpendicular to the direction of pull of the crystal during crystal growth.

Unfortunately, there are some problems related to the presence of oxygen during the growth of high-resistivity silicon wafers in a CZ apparatus. During crystal growth within a CZ apparatus, oxygen from the quartz crucible tends to be introduced into the silicon crystal and is maintained in the interstitial spaces of the silicon crystal lattice. The interstitial oxygen atoms are normally electrically neutral, but the oxygen atoms tend to agglomerate as oxygen-containing thermal donors (OTDs), which become electron donors when subjected to heat in the range of 350° C. to 500° C. Thus, the resistivity of the wafer may be unfavorably decreased by a relatively mild heating due to the contribution of electrons from the OTDs residing in the wafer. The decrease in resistivity due to the oxygen is especially problematic considering that temperatures in the range of 350° C. to 500° C. are commonly encountered during process steps subsequent to wafer fabrication, such as during device fabrication.

The elimination of oxygen from the silicon lattice is not a complete solution to the problem of resistivity variation within a silicon wafer. The presence of oxygen within the silicon crystal causes oxygen precipitate bulk defects to form within the crystal. Though large numbers of bulk defects are not desired, small numbers of bulk defects contribute to a gettering effect within the crystal. By gettering, the defects within the crystal act to trap mobile ionic contamination and to prevent the contamination from traveling to the surface of the wafer. The gettering is necessary to protect the devices on the surface of the wafer from interference from the contaminants.

As described in European Patent Office publication EP 1087041 A1, incorporated herein by reference, there is known a method of producing a high-resistivity wafer having a high gettering effect while preventing the reduction of resistivity due to electrons being donated from OTDs upon subsequent heating cycles of the wafer. The method includes first producing a single crystal ingot having a resistivity of 100 Ω·cm or greater and an initial interstitial oxygen concentration of 10 to 25 parts per million atomic (ppma) by a CZ method. Interstitial oxygen is then precipitated with a gettering heat treatment step until the residual interstitial oxygen concentration in the wafer becomes about 8 ppma or less. The precipitated oxygen does not have the ability to donate electrons like the OTDs formed from interstitial oxygen so subsequent heat treating processes do not result in a reduction in resistivity.

The use of the gettering heat treatment step is capable of reducing the oxygen content of a 100 Ω·cm wafer from 10 to 25 ppma to 8 ppma or less while generating or maintaining a bulk defect density of $1 \times 10^8$ to $2 \times 10^{10}$ defects/cm$^3$. This number of defects is sufficient to provide gettering to the wafer in order to trap contaminants and prevent the contaminants from moving to the surface of the wafer. The wafer described above will maintain high resistivity through subsequent low temperature heat treatments, such as device heat treatments at 350° C. to 500° C., while maintaining sufficient gettering effect.

The main drawback with the above described gettering heat treatment, however, is the process time required to precipitate the oxygen within the wafer. Typically, for example, the heat treatment process may require a first heating step of 800° C. for 4 hours, a second heat treating step of 1000° C. for 10 hours, and a third heat treatment step of 1050° C. for 6 hours. The extended process time required to maintain the wafer at temperature until the oxygen content of the wafer is reduced from 10 to 25 ppma to 8 ppma or less lowers the overall efficiency of the wafer making process, both in terms of time and in terms of power requirements.

What is needed is a method of improving the speed and quality of the precipitation of interstitial oxygen during the gettering heat treatment of a high-resistivity wafer in which oxygen content of the wafer is reduced from 10 ppma or greater to 8 ppma or less and in which the bulk defect density is $1 \times 10^8$ to $2 \times 10^{10}$ defects/cm$^3$.

SUMMARY OF THE INVENTION

The invention is a method of treating a high-resistivity silicon wafer containing interstitial oxygen in such a way that the oxygen is largely precipitated, which prevents the oxygen from acting as an electron donor and prevents the resistivity of the wafer from diminishing. Specific dopants are used to aid precipitation of the oxygen and to minimize the thermal energy required to cause precipitation.

The improved method of obtaining a wafer exhibiting high resistivity and high gettering effect while preventing the reduction of resistivity due to the generation of oxygen donors is provided by: a) using the CZ method to grow a silicon single crystal ingot having a resistivity of 100 Ω·cm or more and an initial interstitial oxygen concentration of 10 to 40 ppma while doping the crystal with electrically inactive impurities which enhance oxygen precipitation during a high temperature annealing process, b) processing the ingot into a wafer, and c) subjecting the wafer to an oxygen precipitation heat treatment whereby the residual interstitial oxygen content in the wafer is reduced to about 8 ppma or less. Exemplary electrically inactive impurities are nitrogen, carbon, or tin.

The resulting wafer has high resistivity, increased gettering ability, and is resistant to slip dislocations. Precipitation of the interstitial oxygen content prevents the oxygen constituents from becoming electrically active electron donors upon subsequent heat treatments of the silicon wafer, such as during device fabrication. Thus, a consistent wafer resistivity may be maintained without undue change caused by undesirable electron donation from oxygen content within the wafer. Nitrogen, carbon, and tin are electrically inactive and encourage the precipitation of oxygen, minimizing process times and providing for more efficient precipitation.

BRIEF DESCRIPTION OF THE DRAWINGS

Figure 1:
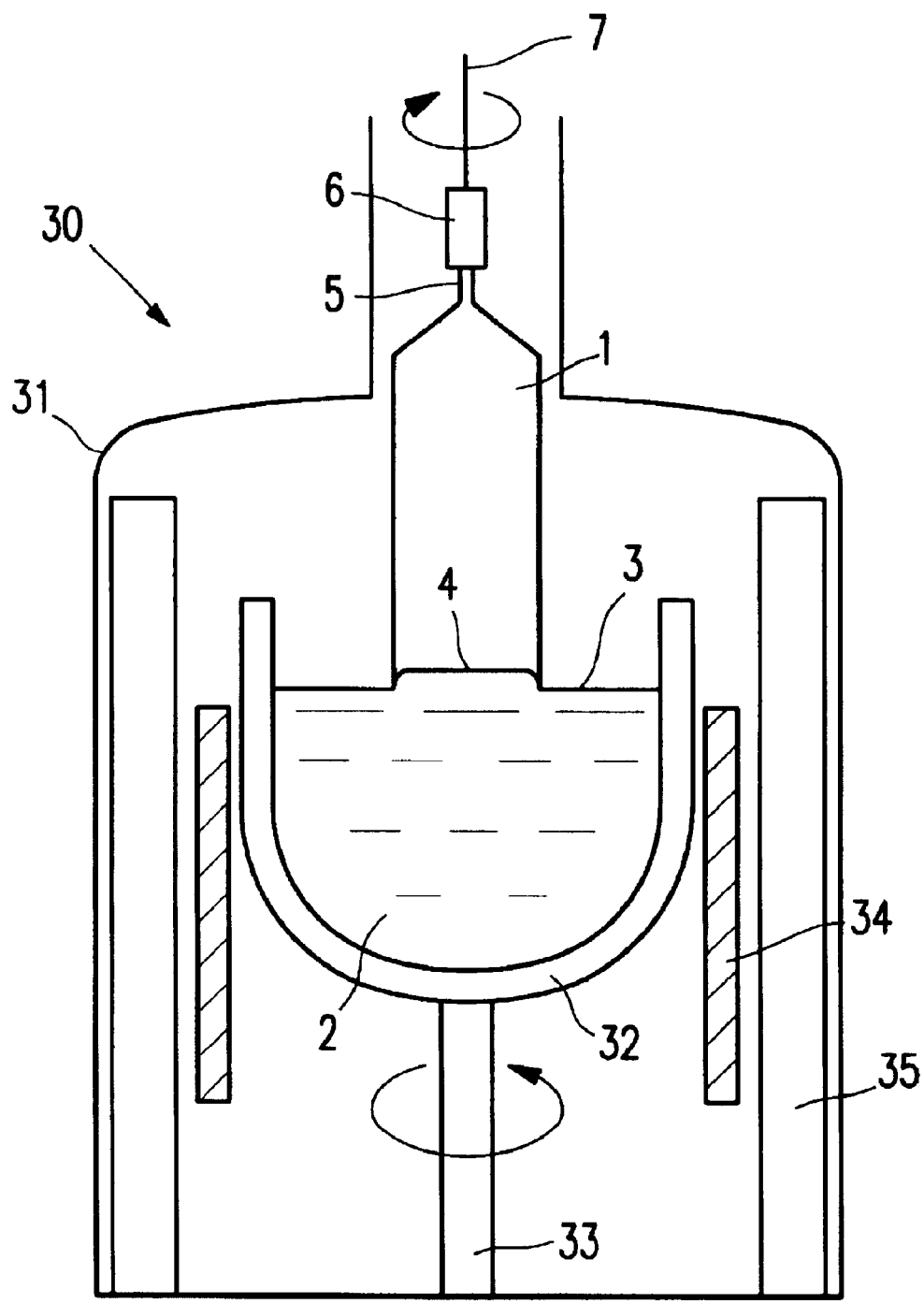

Having thus described the invention in general terms, reference will now be made to the accompanying drawing, which is not necessarily drawn to scale, and wherein:

FIG. 1 illustrates an exemplary Czochralski crystal growing apparatus.

DETAILED DESCRIPTION OF THE INVENTION

The present invention now will be described more fully hereinafter with reference to the accompanying drawing. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

An improved method of obtaining a wafer exhibiting high resistivity and a high gettering effect while preventing the reduction of resistivity due to the generation of oxygen donors is provided by: a) using the CZ method to grow a silicon single crystal ingot having a resistivity of 100 Ω·cm or more and an initial interstitial oxygen concentration of 10 to 40 ppma while doping the crystal with electrically inactive impurities which enhance oxygen precipitation during a high temperature annealing process, b) processing the ingot into a wafer, and c) subjecting the wafer to an oxygen precipitation heat treatment whereby the residual interstitial oxygen content in the wafer is reduced to about 8 ppma or less. Exemplary electrically inactive impurities include nitrogen, carbon, or tin.

The resulting wafer has high resistivity, increased gettering ability, and is resistant to slip dislocations. Precipitation of the interstitial oxygen content prevents the oxygen constituents from becoming electrically active OTDs upon subsequent heat treatments of the silicon wafer, such as during device fabrication. Thus, a consistent wafer resistivity may be maintained without undue change caused by undesirable electron donation from oxygen content within the wafer.

By maintaining considerable amounts of oxide precipitates within the bulk portion of the wafer, however, the oxide precipitates provide sufficient gettering within the bulk portion of the wafer to prevent contaminants within the bulk portion from moving to the surface portion of the wafer.

Doping of the crystal with nitrogen or a similar electrically inactive dopant prior to the oxygen precipitation heat treatment promotes the precipitation of oxygen. With nitrogen, the oxygen precipitation is accelerated in the bulk portion of the silicon wafer by the presence of the nitrogen dopant atoms, which serve as nucleation sites for oxygen, and therefore a high resistivity wafer having an interstitial oxygen content of 8 ppma or less can be produced in a much more rapid manner by not requiring as lengthy of a heat treatment as in conventional techniques.

Growth of Crystal and Processing into a Wafer

The general method of growing silicon ingots according to the CZ method and thereafter slicing the ingots into silicon wafers is known in the art. General reference on performing the CZ method is provided by Ullmann's Encyclopedia of Industrial Chemistry, vol. A23, p.727-731 (1993) and further by Van Zant, Peter, Microchip Fabrication, Fourth Edition, p.53-55 (2000).

An exemplary structure of the apparatus for pulling a single crystal by the CZ method is shown in FIG. 1. The apparatus 30 for pulling a single crystal is constituted by a pulling chamber 31, crucible 32 provided in the pulling chamber 31, heater 34 disposed around the crucible 32, crucible-holding shaft 33 for rotating the crucible 32 and rotation mechanism therefore (not shown), seed chuck 6 for holding a silicon seed crystal 5, cable 7 for pulling the seed chuck 6, and winding mechanism (not shown) for rotating and winding the cable 7. The crucible 32 is composed of an inner quartz crucible for accommodating a silicon melt 2, and an outer graphite crucible. Further, insulating material 35 surrounds the outside of the heater 34. A cylindrical cooling apparatus (not shown) for cooling the single crystal by jetting cooling gas, or shielding radiant heat may be provided.

In operation of the apparatus, a silicon polycrystalline material is melted in the crucible 32 by heating to a temperature higher than about 1420° C. Using a nitrogen dopant as an example, a silicon wafer having a nitride film is introduced into the crucible for doping with nitrogen. Alternatively, nitrogen is added in the form of powdered $Si_3N_4$. A seed crystal 5 is brought into contact with the melt 2 at its approximate center portion by reeling out the cable 7. The crucible-holding shaft 33 is rotated in an optional direction, and the seed crystal 5 is simultaneously pulled upwardly by winding up the cable 7 with rotating the cable to start the growing of single crystal. Thereafter, a single crystal ingot 1 doped with nitrogen approximately in a cylindrical shape can be obtained by appropriately controlling the pulling rate and temperature.

In general, the required amount of nitrogen doping is between about $1 \times 10^{13}$ and $5 \times 10^{15}$ nitrogen atoms/cm³ of the wafer. Doping amounts less than about $1 \times 10^{13}$ atoms/cm³ do not provide the proper precipitation of oxygen within the wafer. Doping amounts of nitrogen greater than about $5 \times 10^{15}$ atoms/cm³ tend to prevent proper crystallization of the silicon crystal, and are therefore not preferred.

More preferred ranges of nitrogen are between about $1 \times 10^{13}$ and $1 \times 10^{14}$ atoms/cm³. At nitrogen doping concentrations above about $1 \times 10^{13}$ atoms/cm$^3$ the nitrogen constituents provide nuclei for oxygen precipitation which are stable at high temperatures, for instance 1000° C. Thus, such concentrations are able to provide precipitate nucleation during heat treatments associated with most device formation procedures, epitaxial deposition, or other processing steps subsequent to wafer fabrication. As mentioned, nitrogen concentrations of less than $5 \times 10^{15}$ atoms/cm$^3$ are preferred to prevent interruptions in the crystalinity of the silicon ingot or wafer. It is preferred to have nitrogen content less than about $5 \times 10^{14}$ atoms/cm$^3$ in order to avoid crystal defects such as stacking faults within the high resistivity wafer or any epitaxial layer deposited thereon.

A known method for incorporating nitrogen into a silicon ingot is described in U.S. Pat. No. 6,059,875 to Kirkland et al., incorporated herein by reference. The reference describes a method of adding a nitrogen-containing powder, such as silicon nitride powder, to a vessel containing a silicon material and then heating the silicon and nitride containing powder until the powder dissolves into the silicon melt. While nitrogen doping is especially effective to hasten oxygen precipitation, other dopants can also be utilized. The suitable dopants are generally characterized as being electrically inactive. Electrically inactive dopants which are also suitable for use with this invention include tin and carbon.

The addition of Sn to a silicon lattice suppresses the generation of OTDs, those oxygen constituents within a silicon lattice which donate electrons and change the resistivity of the silicon material. It is thought that the substitutional Sn relaxes the silicon lattice and thereby enhances oxygen precipitation within the lattice. During heat treatment of an oxygen containing lattice, such as during device fabrication upon a silicon wafer, OTDs formed from interstitial oxygen typically supply electrons to the lattice, lowering the resisitivity. The addition of Sn to the lattice encourages the precipitation of oxygen upon heat treatment which lowers the amount of interstitial oxygen available to form OTDs.

The end result of doping a silicon ingot with Sn and then heat treating silicon wafers produced from the Sn doped ingot is much the same as the result achieved with nitrogen doping. Both nitrogen and tin encourage the formation of oxygen precipitates within the silicon lattice. This increased oxygen precipitation is a critical factor in the effectiveness of the overall method of using the CZ method to grow a silicon single crystal ingot doped with nitrogen or tin and having a resistivity of 100 Ω·cm or more, preferably 1000 Ω·cm, and an initial interstitial oxygen concentration of 10 to 40 ppma, subsequently processing the ingot into a wafer, and subjecting the wafer to an oxygen precipitation heat treatment whereby the residual interstitial oxygen content in the wafer is reduced to about 8 ppma or less while reducing the time and power requirements necessary for precipitating the oxygen in comparison to conventional techniques. The doping of silicon with Sn in the amount of $1 \times 10^{15}$ to $1 \times 10^{19}$ atoms/cm$^3$ avoids crystal defects within the doped wafer.

Doping with carbon is analogous to nitrogen doping and the above-described procedures concerning the addition of nitrogen to a silicon melt are equally applicable to carbon and carbon doping. For effective oxygen precipitation, silicon is doped with carbon in the amount of $1 \times 10^{16}$ to $10^{17}$ atoms/cm$^3$.

The amount of oxygen which is introduced into the crystal during crystal growth may be controlled somewhat through variations in the rate of rotation of the crucible, the amount and flowrate of gas within the CZ chamber, the pressure of the atmosphere within the CZ chamber, and temperature distribution within the silicon melt.

It is desired, though not essential to the invention, that the amount of interstitial oxygen contained within the silicon ingot remain constant along the direction of pull. In other words, it is desirable that the concentration of oxygen not vary as the ingot is pulled from the polysilicon melt of the CZ process. The main source of oxygen which contributes to the silicon ingot is derived from the quartz crucible which contains the polysilicon melt. Oxygen from the quartz is released into the melt and eventually becomes locked as interstitial particles within the silicon lattice of the crystal. Several things influence the amount of oxygen which is allowed to form within the silicon matrix. First, the amount of oxygen available varies with the level of polysilicon within the quartz crucible. Second, the amount of oxygen available varies with the amount of silicon oxide that is allowed to vaporize from the polysilicon melt and be evacuated from the CZ chamber.

European Patent Office publication EP 0837159A1 describes a method of controlling oxygen content within a silicon ingot along the direction of pull. The disclosed method of controlling oxygen content may optionally be used in conjunction with the invented method to provide for uniform oxygen content within the ingot. The method entails increasing the pressure of the atmosphere above the polysilicon melt as the crystal ingot is pulled. Increasing the pressure of inert gas above the polysilicon melt inhibits the vaporization of silicon oxide from the melt, which increases the amount of oxygen available to the melt and crystal. By gradually increasing the pressure of the atmosphere above the polycrystalline melt during formation of the crystal, a uniform amount of oxygen provided to the growing crystal can be maintained.

After the completion of crystal growth, the grown crystal ingot is sliced into wafers using techniques commonly available in the art of silicon wafer processing.

Heat Treatment

The high-resistivity wafer cut from the grown crystal ingot is subjected to a gettering heat treatment process until the residual interstitial oxygen concentration within the wafer becomes 8 ppma or less. The heat treatment reduces the bulk defect density to between $1 \times 10^8$ and $5 \times 10^{10}$ defects/cm$^3$, normally between $1 \times 10^8$ and $2 \times 10^{10}$ defects/cm$^3$.

The gettering heat treatment may vary considerably, depending on the previous processing of the silicon ingot and wafer, but will generally consist of 1, 2, or 3 heat stages, each of differing temperature. Each heating stage preferably occurs in an inert atmosphere such as nitrogen or argon, but may contain small amounts of $O_2$.

An exemplary single stage heat treatment comprises heating the high resistivity wafer at 1000° C. for 16 hours. An exemplary dual stage heat treatment comprises heating at 800° C. for 4 hours, raising the temperature to 1000° C. over a 5 hour period, and then heating at 1000° C. for 14 hours. An exemplary three stage heat treatment comprises heating the high resistivity wafer to 650° C. for 2 hours, then heating the wafer at 800° C. for 4 hours, and then heating the wafer at 1000° C. for 16 hours. It is recognized that the amount of heat treatment required will vary depending upon the values of initial and final desired interstitial oxygen within the wafer. Those wafers having higher values of initial interstitial oxygen, around 40 ppma, may be heat treated within considerably shorter heat treatment times than those wafers with relatively low initial interstitial oxygen content.

For the mass production of wafers, batch heat treatment furnaces, as are commonly known in the art of silicon wafer production, may be used for the heat treatment of the wafers.

Use of the furnace allows for the simultaneous heat treatment of several wafers, lowering the required per wafer process time. The heat treatment furnace is capable of maintaining elevated temperatures within a predetermined range and is capable of rapidly increasing and decreasing the temperature within the furnace. The atmosphere within the furnace is also carefully controlled and is typically argon, nitrogen, or other inert or nearly inert gas.

The amount of interstitial oxygen within the silicon crystal, after production of the crystal but prior to any precipitation heat treatment, should be between about 10 ppma and 40 ppma. A minimum amount of interstitial oxygen is required within the silicon so as to effectively getter impurities. In this regard, 10 ppma is an approximate minimum amount of interstitial oxygen that should be present before heat treating. Conversely, exceedingly high amounts of interstitial oxygen in the crystal lead to excessive precipitation which tends to weaken the structure of the crystal. An approximate upper limit of acceptable interstitial oxygen content is 40 ppma, and a typical upper limit of interstitial oxygen content is 25 ppma. It is noted that lower or higher amounts of oxygen content may be used, but the resulting wafer would have reduced gettering capacity or increased degradation of physical structure, respectively.

In silicon wafer production, favorable qualities associated with high resistivity are encountered at resistivities above about 100 Ω·cm. In accordance with this invention, it is preferred that the wafers have a resistivity of 1000 Ω·cm or greater. Therefore, the resistivity of the silicon wafer should be greater than 1000 Ω·cm both before and after the oxygen precipitation heat treatment. Resistivity may certainly be higher than 1000 Ω·cm and may be tailored to the demands imposed by a subsequent device fabrication process.

While the wafers described hereinabove may serve as the substrate for subsequent device fabrication, the oxygen precipitation heat treated wafers may optionally be utilized as base layers, or as both layers, in the production of silicon on insulation (SOI) wafers. In SOI production, a thin upper "bond" layer formed of a thin silicon wafer having very few defects is placed atop a "base" layer formed of a thicker silicon wafer. The two layers are fused together with an insulating material, usually a thin layer of oxide film.

When used as a base layer in an SOI wafer, the high resistivity of the oxygen precipitation heat treated wafer reduces signal transmission loss, which is especially useful with high frequency devices. Additionally, the gettering ability of the oxygen precipitation heat treated wafer traps contaminants and prevents the wafer contaminants in the base wafer from transferring into the low defect bond wafer.

Optionally, in production of the SOI wafer, heat treatment required to fuse the bond layer to the base layer with the thin oxide layer may also serve as the final stage in the oxygen precipitation heat treatment of the base layer. In this manner, the oxygen precipitation heat treatment of the base layer may be started before contact of the base layer with the bond layer or the oxide film. Prior to completion of the oxygen precipitation heat treatment, the base layer and bond layer are contacted via the oxide film and subsequent heating acts to simultaneously complete the oxygen precipitation heat treatment and fuse the two silicon wafers together via the oxide film, creating a SOI wafer in less time and with lower power requirements than if the oxygen precipitation heat treatment and SOI bonding heat treatment were not carried out simultaneously. Of course, consecutive heat treatments, though not preferred, are well within the scope of this invention.

When SOI wafers are produced with the simultaneous oxygen precipitation heat treatment and SOI bonding heat treatment steps, the first portion of the oxygen precipitation heat treatment is preferably performed prior to the final polishing of the upper surface of the base wafer. This is because slight alterations in the surface of the base wafer may occur as oxygen and other impurities near the surface of the wafer are out-gassed during heat treatment. Thus, final polishing of the upper surface of the base layer should be accomplished after the initial stages of the oxygen precipitation heat treatment but before mating the base layer with the oxide layer and the bond wafer. While the oxygen precipitation heat treatment is preferably performed prior to the final polishing of the wafer, it should be noted that the oxygen precipitation heat treatment described herein may be successfully utilized at any point in polishing, etching, or deposition process.

An epitaxial layer may optionally be deposited upon a surface of the high resistivity wafer prior to device fabrication. In the case of epitaxial deposition, the surface of the wafer should be high temperature heat treated as described above before deposition of the epitaxial layer. Deposition of the epitaxial layer provides an overall wafer having a high resistivity, a defect free surface, and a bulk portion with low interstitial oxygen content and improved gettering ability.

Surface oxygen is optionally out-diffused during a denuding heat treatment of the wafer. Although precipitated oxygen and interstitial oxygen are desirable within the bulk portion of the wafer due to their gettering ability, oxygen is not desired in the surface portion of the wafer where the electronic devices are fabricated. To remove oxygen from the surface of the wafer, the wafer is heat treated at about 900° C. or higher, preferably between about 100° C. and 1250° C., which out-diffuses the interstitial oxygen from the surface of the wafer and creates a denuded zone (DZ layer). The high temperature heat treatment also out-diffuses any nitrogen residing near the surface of the wafer. The denuding heat treatment need only be maintained for a short period of time relative to the heat treatment required for the oxygen precipitation. Upon a denuding heat treatment, oxygen is out-diffused from the surface of the wafer. The out-diffusion results in an oxygen gradient within the surface of the wafer, with oxygen content increasing with depth. The longer the wafer is subjected to the denuding heat treatment, the deeper the resulting denuded zone will extend within the wafer.

By way of example, at a temperature of 1150° C., a wafer should be heat treated for approximately 30 minutes to provide a 10 μm thick DZ layer with an oxygen concentration of 1 ppma or less at the wafer surface. Heat treatment for approximately 2 hours provides a 20 μm thick DZ layer with an oxygen concentration of 1 ppma or less at the wafer surface. The denuding heat treatment preferably occurs in a hydrogen or other inert atmosphere, but may contain small amounts of $O_2$. The denuding heat treatment should occur at the beginning of the heat treating process, and begins the precipitation of oxygen within the wafer.

Another effect of nitrogen doping is the reduction of the as-grown size of vacancy defects, known as crystal originated particles (COPs) within the wafer. Because the COPs are of reduced size, the voids can be more easily eliminated from the surface region of the wafer by a high-temperature heat treatment step. The conventional approach is to grow a thin epitaxial layer over the COP laden wafer, but the reduced size of the COP due to the nitrogen doping allows for the removal of the COP with an initial heat treatment step, without the need to grow a costly epitaxial layer. To this end, a short high-temperature annealing process is optionally employed prior to the oxygen precipitation heat treatment. Duration and temperatures of the optional COP heat treatment step are similar to those of the optional denuding heat treatment discussed above.

A silicon wafer treated in accordance with the invented method exhibits an interstitial oxygen concentration of 8 ppma or less and an oxide precipitate density of $1 \times 10^8$ to $2 \times 10^{10}$ defects/cm$^3$. Since the unprecipitated interstitial oxygen does not favorably contribute to the gettering ability of the wafer material, the residual interstitial content is preferably below 6 ppma. After treatment in accordance with this invention, any subsequent heat treatment of the silicon wafer between about 350° C. and 500° C. will result in negligible change in resistivity of the wafer. This temperature range is important, because it is a common range of temperatures experienced during device production heat treatment, collectively referring to the various heat treatments used in the device fabrication process, such as electrode wiring. By eliminating resistivity change subsequent to wafer fabrication, microchip producers can easily predict the resistivity of the wafer after device fabrication. In wafers of the prior art, resistivity of the silicon wafer would change with each device fabrication heat treatment step, making final resistivity difficult to predict and similarly making device performance somewhat hard to predict.

Another benefit of the above described heat treatment is that oxygen precipitate and residual interstitial oxygen formed in the bulk portion of the wafer act to suppress slip dislocations. The tendency to suppress slip dislocations is surprising, given the fact that oxide precipitation within a wafer typically promotes slip dislocations.

However, the addition of nitrogen, tin, or carbon to the crystal before the crystal is subjected to heat treatment is thought to contribute to the ready formation of oxide precipitate upon heat treatment which does not promote the formation of slip dislocations.

The resistance to slip dislocations enables the wafer to be mechanically handled during heat treatment without defects developing within the wafer due to mechanical stresses upon the wafer. The practical effect of the slip dislocation suppression is that the wafers may be handled in heat treatment boats or other heat treatment equipment without imparting defects to the wafer.

As has been shown, the addition of electrically inactive dopants to the high-resistivity silicon wafer contributes to the ready formation of oxide precipitates within the wafer, lowers the process time necessary to heat treat the wafer for oxygen precipitation, and lowers the size of COP defects, enabling the removal of COP from the wafer with heat treatment and avoiding the need for a costly epitaxial layer.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A high-resistivity silicon wafer comprising:
a wafer substrate having a resistivity of 100 Ω·cm or greater,
an interstitial oxygen content of 8 ppma or less,
an oxide precipitate density between about $1 \times 10^8$ and about $2 \times 10^{10}$ defects/cm$^3$, and
a dopant selected from nitrogen, tin, and carbon.

2. The wafer of claim 1, wherein the dopant is nitrogen.

3. The wafer of claim 2, wherein the concentration of dopant is between about $1 \times 10^{13}$ and about $5 \times 10^{15}$ atoms/cm$^3$.

4. The wafer of claim 3, wherein the concentration of dopant is between about $1 \times 10^{13}$ and about $5 \times 10^{14}$ atoms/cm$^3$.

5. The wafer of claim 1, wherein the dopant is tin.

6. The wafer of claim 5, wherein the concentration of the dopant is between about $1 \times 10^{15}$ and about $1 \times 10^{19}$ atoms/cm$^3$.

7. The wafer of claim 1, wherein the dopant is carbon.

8. The wafer of claim 7, wherein the dopant has a concentration between about $1 \times 10^{16}$ and about $1 \times 10^{17}$ atoms/cm$^3$.

9. The wafer of claim 1, further comprising a bond layer of silicon bonded the high-resistivity wafer.

10. The wafer of claim 9, further comprising a thin oxide film disposed between the bond layer and the high-resistivity layer, whereby the thin oxide films acts to bond the bond layer to the high-resistivity layer.

11. The wafer of claim 1, further comprising an epitaxial layer deposited upon the high-resistivity wafer.

12. A method for producing a silicon wafer which retains high-resistivity throughout device fabrication heat treatment, comprising:
growing a silicon single crystal ingot having a resistivity of 100 Ω·cm or more and an initial interstitial oxygen concentration of 10 to 40 ppma by the Czochralski method while
doping the silicon single crystal ingot with nitrogen,
processing the silicon single crystal ingot into a high-resistivity wafer having opposed first and second surfaces,
subjecting the high-resistivity wafer to an initial oxygen precipitation heat treatment,
contacting a second silicon wafer to the first surface of the high-resistivity wafer via a thin oxide film, and
subjecting the wafers to a final oxygen precipitation heat treatment, thereby
reducing the residual interstitial oxygen concentration in the high-resistivity wafer to 8 ppma or less, and
bonding the high-resistivity wafer and second wafer to form a single silicon on insulation (SOI) wafer.

13. A method for producing a silicon wafer which retains high-resistivity throughout device fabrication heat treatment, comprising:
growing a silicon single crystal ingot having a resistivity of 100 Ω·cm or more and an initial interstitial oxygen concentration of 10 to 40 ppma by the Czochralski method while doping the silicon single crystal ingot with a dopant selected from nitrogen, carbon, and tin,
processing the silicon ingot into a high-resistivity wafer, and
subjecting the high-resistivity wafer to an oxygen precipitation heat treatment causing the residual interstitial oxygen concentration of the wafer to become 8 ppma or less.

14. The method of claim 13, wherein the step of growing a silicon crystal ingot comprises growing a silicon crystal ingot having a resistivity of 1000 Ω·cm or more.

15. The method of claim 15, wherein the step of subjecting the high-resistivity wafer to an oxygen precipitation heat treatment causes the residual interstitial oxygen concentration in the wafer to become 6 ppma or less.

16. The method of claim 13, further comprising the step of final polishing at least one surface of the wafer after subjecting the wafer to the oxygen precipitation heat treatment.

17. The method of claim 13, further comprising the step of final polishing at least one surface of the wafer before subjecting the wafer to the oxygen precipitation heat treatment.

18. The method of claim 13, wherein the oxygen precipitation heat treatment occurs between about 650° C. and about 1000° C.

19. The method of claim 18, further comprising the step of providing a denuded zone (DZ) on the surface of the wafer by performing a denuding heat treatment at 900° C. or higher.

20. The method of claim 13, wherein subjecting the wafer to an oxygen precipitation heat treatment comprises oxygen precipitation heat treating the wafer until the wafer has a bulk defect density of $1 \times 10^8$ to $5 \times 10^{10}$ defects/cm$^3$.

21. The method of claim 20, wherein subjecting the wafer to an oxygen precipitation heat treatment comprises oxygen precipitation heat treating the wafer until the wafer has a bulk defect density of less than $2 \times 10^{10}$.

22. The method of claim 13, wherein the step of doping the crystal ingot comprises doping the crystal ingot with nitrogen.

23. The method of claim 22, wherein the step of doping with nitrogen comprises doping with nitrogen at a concentration between about $1 \times 10^{13}$ and about $5 \times 10^{15}$ atoms/cm$^3$.

24. The method of claim 23, wherein the step of doping with nitrogen comprises doping with nitrogen at a concentration between about $1 \times 10^{13}$ and about $5 \times 10^{14}$ atoms/cm$^3$.

25. The method of claim 13, wherein the step of doping the crystal ingot comprises doping the crystal ingot with tin.

26. The method of claim 25, wherein the step of doping with tin comprises doping with tin at a concentration between about $1 \times 10^{15}$ and about $1 \times 10^{19}$ atoms/cm$^3$.

27. The method of claim 13, wherein the step of doping the crystal ingot comprises doping the crystal ingot with carbon.

28. The method of claim 27, wherein the step of doping with nitrogen comprises doping with nitrogen at a concentration between about $1 \times 10^{16}$ and about $1 \times 10^{17}$ atoms/cm$^3$.

29. The method of claim 13, wherein the high-resistivity wafer has opposed first and second surfaces, and further comprising bonding a second silicon wafer to the first surface of the high-resistivity wafer to form a single silicon on insulation (SOI) wafer.

30. The method of claim 29, wherein the high-resistivity wafer and the second silicon wafer are bonded by a thin oxide film disposed between the wafers.

31. The method of claim 13, wherein the high-resistivity wafer has opposed first and second surfaces, and further comprising the step of depositing an epitaxial layer upon the first surface of the high-resistivity wafer.

32. The method of claim 13, wherein the step of subjecting the high-resistivity wafer to an oxygen precipitation heat treatment occurs in a batch heat treatment furnace.

33. The method of claim 13, wherein the step of growing a silicon single crystal ingot comprises growing a silicon single crystal having a resistivity of 100 Ω·cm or more and an initial interstitial oxygen concentration of 10 to 25 ppma.

* * * * *